United States Patent [19]

Lepejian et al.

[11] Patent Number: 6,092,030

[45] Date of Patent: Jul. 18, 2000

[54] TIMING DELAY GENERATOR AND METHOD INCLUDING COMPENSATION FOR ENVIRONMENTAL VARIATION

[75] Inventors: Yervant D. Lepejian, Palo Alto; Lawrence A. Kraus, San Jose; Julie D. Segal, Palo Alto; John M. Caywood, Sunnyvale, all of Calif.

[73] Assignee: Credence Systems Corporation, Fremont, Calif.

[21] Appl. No.: 08/831,853

[22] Filed: Apr. 2, 1997

[51] Int. Cl.[7] .................................................. H03H 11/26
[52] U.S. Cl. ........................... 702/79; 714/700; 327/261; 327/276
[58] Field of Search ............................. 702/79, 124–126; 327/176, 261, 292, 31; 714/700; 363/41

[56] References Cited

U.S. PATENT DOCUMENTS

| | | | |
|---|---|---|---|
| 4,124,820 | 11/1978 | Arnstein | 328/55 |
| 4,511,846 | 4/1985 | Nagy et al. | 327/176 |
| 4,550,405 | 10/1985 | West | 371/1 |
| 4,675,562 | 6/1987 | Herlein et al. | 327/277 |
| 4,789,835 | 12/1988 | Herlein | 327/261 |
| 4,837,521 | 6/1989 | Herlein et al. | 327/261 |
| 5,594,631 | 1/1997 | Katoozi et al. | 363/41 |
| 5,869,992 | 2/1999 | Sekino | 327/276 |

OTHER PUBLICATIONS

Branson, et al., "Integrated PIN Electronics for a VLSI Test System," IEEE International Test Conference, Paper 2.2, pp. 23–27, 1988.

Chapman, et al., "High Performance Sub–Half Micron CMOS Using Rapid Thermal Processing," International Electronic Devices Meeting of the IEEE, Technical Digest, Washington, D.C. Dec. 8–11, 1991.

Shahidi, et al., "A High Performance BICMOS Technology Using 0.25 $\mu$m CMOS and Double Poly 47 GHz Bipolar," Symposium on VLSI Technology, Jun. 2–4, 1992, Seattle, WA of the IEEE Electron Devices Society (IEEE Cat. No. 92CH3172–4).

Woerlee, et al., "A Low Power 0.25 $\mu$m CMOS Technology," International Electronic Devices Meeting of the IEEE, Technical Digest, San Francisco, CA, Dec. 13–16, 1992.

*Primary Examiner*—Kamini Shah
*Attorney, Agent, or Firm*—Smith-Hill and Bedell

[57] ABSTRACT

Apparatus for supplying a signal after a predetermined time delay comprises circuitry for generating a base delay signal that is synchronized to a stable master oscillator insensitive to changes in at least one environmental variable. A vernier signal delay circuit provides delay increments smaller than those available from the base delay signal, the delay increments being sensitive to said at least one environmental variable. Storage circuitry is provided for storing information related to the duration of the delay increments as function of at least one environmental variable for which correction is to be supplied. Sensing circuitry is provided for sensing the at least one environmental variable for which correction is to be provided to supply a sensed at least one environmental variable. Control signal generating circuitry is provided, responsive to the sensing means and cooperating with the storage means, for generating a control signal to the vernier signal delay means to select a desired delay from among the delay increments in response to the sensed at least one environmental variable.

15 Claims, 2 Drawing Sheets

TIMING DELAY GENERATOR AND METHOD INCLUDING COMPENSATION FOR ENVIRONMENTAL VARIATION

BACKGROUND OF THE INVENTION

1. Field of the Invention.

The present invention applies to testing for the inspection and verification of the electrical operation of integrated circuits. The present invention is particularly aimed at the problem of applying electrical stimuli to and measuring the response from integrated circuits at precise and accurate time intervals.

2. The Prior Art

Modern integrated circuits are quite complex and to verify the proper operation of these devices it is necessary to apply electrical stimuli and measure the response with high accuracy and precision. It is customary in modern automatic test equipment (ATE) for integrated circuits to have a stabilized master oscillator from which all other timings are derived. A problem arises because it is often desired to generate signals at time intervals shorter than one period of the master oscillator. For example, the master oscillator might have a frequency of 100 MHz. Such an oscillator has a period of 10 nsec. However, in the tester it may be desired to place timing edges with precision of 25 psec and an accuracy of 100 psec. This is typically accomplished by using a delay line to form a timing vernier as is shown in the prior art. The signal passes through the delay line which has taps spaced closely apart in time. By selecting the appropriate taps several signals with intermediate timing can be generated. This procedure has been discussed in some detail by Nagy and by Herlein.

The prior art is primarily concerned with circuits implemented in emitter coupled logic (ECL). ECL is a current mode logic family used in bipolar integrated circuits. Because it is current mode logic, current is steered from one transistor to another. This logic family has the advantages that it is relatively fast and has constant power consumption because of the constant current flowing through the logic elements. Later versions of this logic (e.g. the 100k series) are temperature compensated. For these and perhaps other reasons such as the assumption that the ATE equipment would be used in carefully temperature controlled rooms, the prior art has not been concerned with compensating the delay lines for variation in environmental parameters such as power supply voltage and delay line temperature.

A difficulty with ECL logic is that the power consumption per logic gate is relatively high. This fact has inhibited the use of ECL for high levels of integration because the power consumption exceeds the limits of desirable packages. Fortunately as integrated circuit technology has progressed and demanded higher speed, more accurate and more complicated testing equipment (e.g. modern products have many more external signal connections than earlier products) it has also provided in CMOS technology a very high speed logic technology suitable to very high levels of integration.

One problem that must be overcome for CMOS technology to be applied to the timing vernier circuitry is that CMOS logic propagation delays are dependent upon the power supply voltage and the temperature of the silicon substrate. The supply voltage sensitivity can be managed by very tightly regulating the supply voltage; however this adds cost to the test system. The temperature of the substrate is much more difficult to control. If the power dissipation of a circuit is constant, the substrate temperature can be controlled by placing the circuit in a temperature controlled oven as has been known in the prior art for many years. In CMOS logic, the principal power dissipation is a result of capacitive charging and discharging; consequently, the power dissipation is approximately proportional to the square of the operating frequency. This means that if the circuit operating frequency were to suddenly increase, as it will in many common test modes, the power dissipation may easily increase by a factor of 100. This sudden burst of power is very difficult to account for with an oven.

On the other hand if a means of providing accurate and constant time delays could be provided with CMOS circuitry which is capable of operating over a wider range of environmental conditions, a tester could be fabricated that would not be restricted to rooms with carefully controlled environments, it could increase the utility of the tester just as the modern desktop computer is more flexible than its mainframe predecessor.

It is therefore an object of the present invention to provide a system and method for providing accurate and constant time delays utilizing CMOS circuitry.

It is a further object of the invention to provide a system and method for providing accurate and constant time delays utilizing CMOS circuitry which is capable of operating over a wider range of environmental conditions than heretofore possible.

SUMMARY OF THE INVENTION

According to the present invention, the effect of the significant environmental variables is measured. An adjustment made to the delay circuitry to compensate for the changes in the environmental variable is stored in memory. Circuitry is designed into the integrated circuit that will measure the appropriate environmental variable or variables. The results of the measurement are used in a feedback loop to adjust the delay so that the timing edges are in the correct location with respect to the master oscillator.

There are basically two means by which the delay can be adjusted. Either the tap on the delay line is selected to give the correct delay to the timing edge or the delay line is adjusted so that the propagation rate through the delay line will provide the correct placement of the edge at the output of a given tap in spite of the variation of the environmental parameter.

DETAILED DESCRIPTION OF THE PREFERRED EMBODIMENT

Those of ordinary skill in the art will realize that the following description of the present invention is illustrative only and not in any way limiting. Other embodiments of the invention will readily suggest themselves to such skilled persons.

Modern CMOS logic technologies with feature sizes in the range of 0.25 $\mu$ have propagation delays in the range of 50 psec per stage for unloaded ring oscillators and in the range of 100 psec for lightly loaded ring oscillators (e.g. for fan out of two) at room temperature with supply voltages in the range of 2.5 V to 3.3 V.

Figure 1:
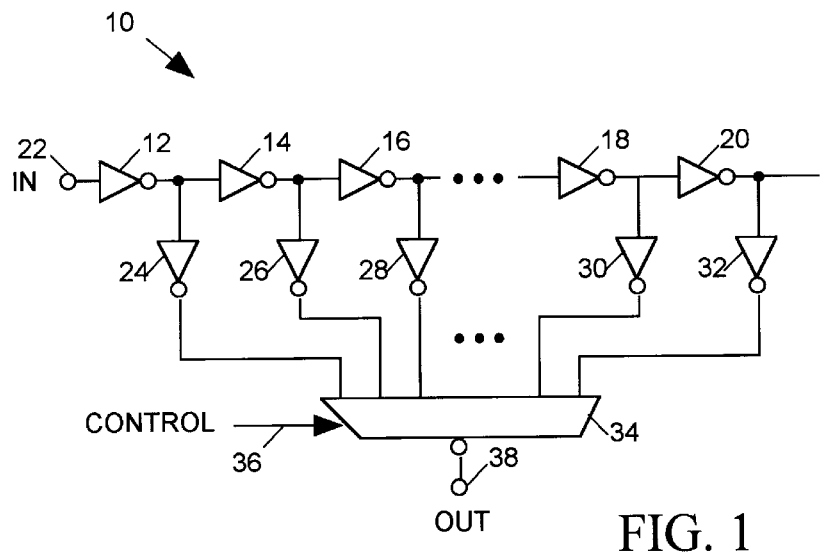
FIG. 1 is a schematic diagram of an illustrative implementation of a delay line according to the present invention that provides outputs of either phase.

This feature of CMOS technology makes possible a delay line of the type shown in schematic form in FIG. 1. The delay line 10 comprises a plurality of cascaded inverters 12, 14, 16, 18, and 20 driven from input node 22. While the illustrative embodiment depicted in FIG. 1 shows five cascaded inverters, the present invention is not limited to the embodiment shown in the figure. Those of ordinary skill in the art will appreciate that other numbers of inverters may be cascaded according to the present invention. In fact, it is contemplated that practical embodiments of the present invention may include several hundred or more inverters. The presence of an arbitrary number of cascaded inverters is illustrated in FIG. 1 by the dashed line between the output of inverter 16 and the input of inverter 18.

The output of each inverter in the cascaded chain of inverters is tapped for use and is buffered by an additional inverter. Thus, inverter 24 buffers the output of cascaded inverter 12 to form a first tap, inverter 26 buffers the output of cascaded inverter 14 to form a second tap, inverter 28 buffers the output of cascaded inverter 16 to form a third tap, inverter 30 buffers the output of cascaded inverter 18 to form an (n-1)th tap, and inverter 32 buffers the output of cascaded inverter 20 to form an nth tap. The outputs of buffering inverters 24, 26, 28, 30, and 32 drive data inputs to multiplexer 34. As will be appreciated by those of ordinary skill in the art, multiplexer 34 has control inputs schematically represented by control line 36. The actual number of control lines 36 will depend on the number of possible inputs to be switched. Multiplexer 34 has an output node 38. In fact, as will be appreciated by those of ordinary skill in the art, the structure of multiplexer 34 will depend on the number of data inputs which need to be serviced. Such skilled persons will readily be able to configure multiplexer 34 for arbitrary numbers of data inputs.

The buffering inverters 24, 26, 28, 30, and 32 in FIG. 1 are provided to buffer the delay line from the capacitive load presented by the input lines of multiplexer 34 in order to minimize the stage delay in the cascaded inverter chain. If these delays are deemed manageable, the buffering inverters 24, 26, 28, 30, and 32 can be omitted with a possible savings in power dissipation and chip area as will be obvious to one of ordinary skill in the art.

For the present disclosure it may be assumed that the delay through each cascaded inverter stage is 100 psec. If the multiplexer 34 selects the output of the first inverter 12, a pulse will appear at the output node 38 that is somewhat delayed from the pulse appearing at input node 22. If the multiplexer 34 selects the output of the third inverter stage at the output of cascaded inverter 16, pulse appearing at the output node 38 will be of the same phase as that appearing when the output of the first stage is selected, but will be delayed by 200 psec. If the output of the second inverter stage at the output of cascaded inverter 14 is selected by the multiplexer, the output will be delayed by 100 psec from the case in which the output of the first stage is selected, but the signal will be inverted. In summary, the outputs from all the odd numbered stages are of the same phase with a delay of 200 psec between each sequential odd numbered stage. The same is true of the even numbered stages. The odd and even numbered stages produce signals of opposite phase with a delay of 100 psec between corresponding even/odd pairs. As will be discussed further herein, it is possible to switch in a delay of ~100 psec into the multiplexer 14 when the odd numbered stages are selected in order that the delay for the even and odd stages be the same.

If the master oscillator were running at 100 MHz, a pulse may be applied to input node 22 in intervals as small as every 10 nsec. This pulse can be used to set an edge on an input signal to the device under test, DUT, or to set a strobe time to measure the response from the DUT as is well known in the art. The delay line provides a vernier on the master clock pulses. For example, if an edge were desired at 11.6 nsec from the start, this would be a delay of one master clock plus eight taps down the delay line. There is some delay through the buffering inverters 24, 26, 28, 30, and 32 and the multiplexer 34. The master clock pulse is delayed by an equivalent amount to allow small delays after the master pulse. Those of ordinary skill in the art will recognize that buffer inverters connected to the outputs of even (or odd) numbered inverters can be omitted at the expense of coarser vernier and non-availability of opposing phase pulses.

Figure 2:
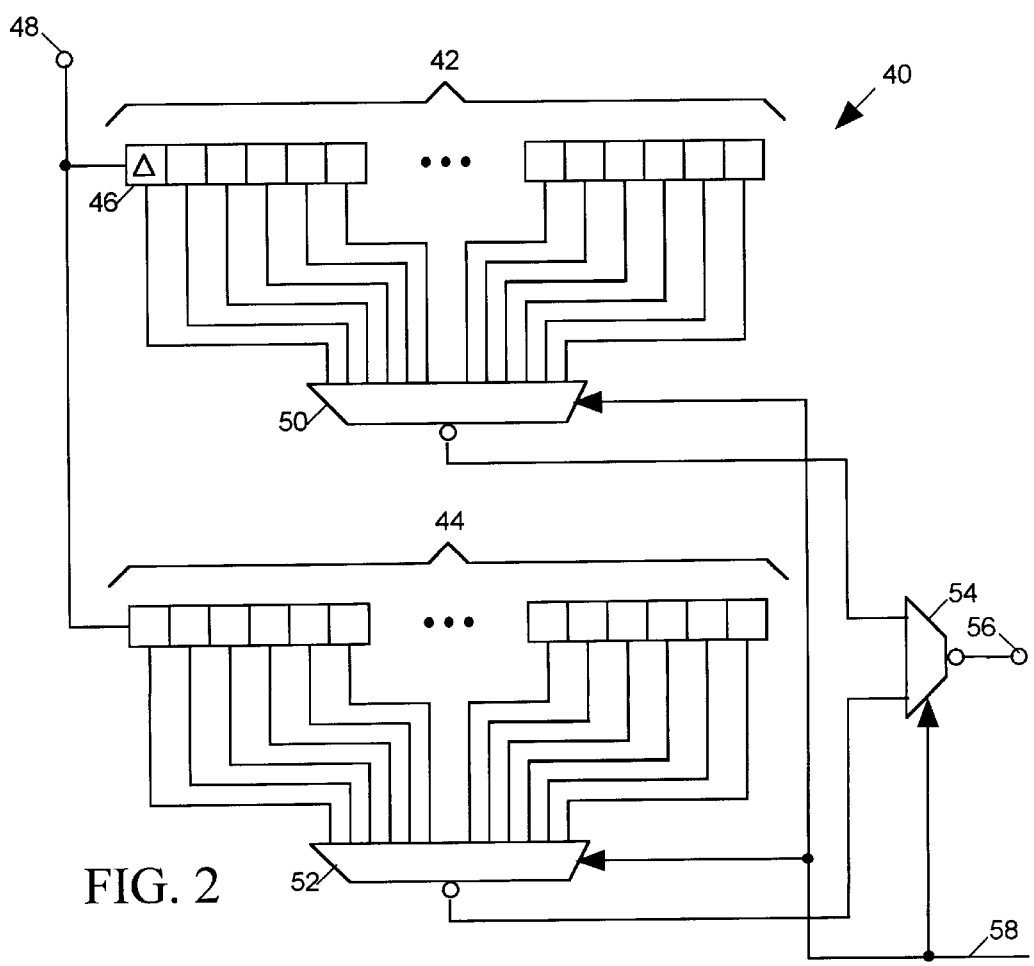
FIG. 2 is a schematic diagram of an illustrative implementation of two delay lines combined in accordance with the present invention to provide timing increments of finer granularity than is possible with a single delay line of the type shown in FIG. 1.

FIG. 2 is a schematic diagram of a circuit 40 which addresses the problem of providing delay increments smaller than the propagation delay through one stage. As may be seen from FIG. 2, circuit 40 includes two delay lines 42 and 44 having similar delays per stage of 200 psec. The individual stages in each delay line which normally include a cascaded inverter and a buffering inverter as seen in FIG. 1, are represented by small squares, one of which is identified by reference numeral 46. Both delay lines are driven from input node 48. Taps from delay line 42 drive multiplexer 50 and taps from delay line 44 drive multiplexer 52. The outputs of multiplexers 50 and 52 are multiplexed in multiplexer 54 to provide an output at output node 56. Control bus 58 is shown for controlling multiplexers 50, 52, and 54 in the conventional manner.

If a delay of 100 psec were introduced into either the first stage of delay line 42 or its output multiplexer 50 (as indicated by the symbol Δ in the first stage of delay line 42 and the multiplexer 50), the outputs on each tap of delay line 42 would be delayed by 100 psec with respect to the outputs from the equivalent tap on delay line 44. Because the pulses from the two delay lines have staggered delays, it is possible to get a pulse with the same phase with delay increments of 100 psec by selecting the appropriate input for either multiplexer 50 or 52. For example, a 100 psec delay is obtained from the first tap of delay line 42 through multiplexer 50, a 200 psec delay is obtained from the first tap of delay line 44 through multiplexer 52, a 300 psec delay is obtained from the second tap of delay line 42 through multiplexer 50, etc.

It will be apparent to persons of ordinary skill in the art that although FIG. 2 shows two delay lines by way of illustration of this aspect of the invention, the present invention is not limited to the exact embodiment illustrated therein. Those of ordinary skill in the art will recognize from the disclosure herein that it is possible to provide finer increments by adding more delay lines each having different delta delays built into either the first stage or the multiplexer. For example, with four delay lines for the case under consideration, it is possible to get resolution of 50 psec with appropriate offsetting delays.

Figure 3:
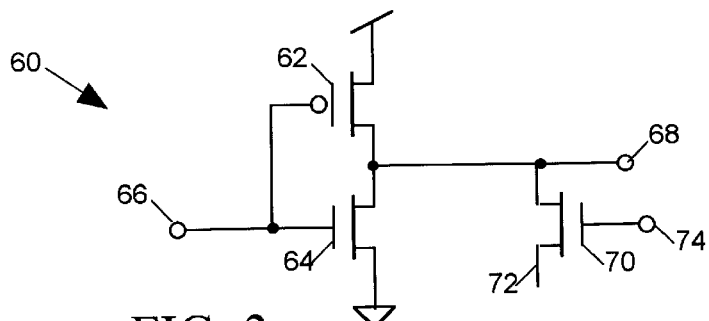
FIG. 3 is a schematic diagram of a typical inverter such as is shown in FIGS. 1 and 2 for a CMOS implementation including a means for adding switchable delay to the output of such an inverter.

FIG. 3 is a schematic diagram of a CMOS inverter 60 according to the present invention formed by the transistor pair consisting of the P-Channel MOS transistor 62 and the N-Channel MOS transistor 64. In this circuit the input is node 66, the common gate line for both transistors 62 and 64, the output is node 68, the common drain connection of both transistors 62 and 64. As is well known in the art, the source of P-Channel MOS transistor 62 is connected to a voltage rail VDD, and the source of N-Channel MOS transistor 64 is connected to a voltage rail ground.

The inverter 60 also includes N-Channel MOS transistor 70 which has its source connected to the output node 68 of the inverter and its drain connected to a floating node 72. Transistor 70 provides a switchable load for the inverter. When node 74, connected to the gate of transistor 70, is at ground, transistor 70 is turned off and only contributes the capacitance of the drain diffusion connected to output node 68 plus the gate drain overlap capacitance to the load. On the other hand, when node 74 is biased high enough to keep transistor 70 turned on (i.e. node 74 should be $\geq$ (VDD+Vt) where Vt is the threshold of transistor 70 with its body at ground), the capacitive load is increased by the gate capacitance of transistor 70 plus the capacitance of the floating source. This capacitance can be selectively added to the output node 68 of the inverter to add a desired gate delay.

In a delay line application such as is discussed here, the inverters can be fairly small. A usable choice for 0.25 $\mu$m scale technology might be an N-Channel MOS transistor 64 with a width to length ratio of (1.0 $\mu$m)/(0.25 $\mu$m) and a P-Channel MOS transistor 62 with the ratio of (2.0 $\mu$m)/(0.25 $\mu$m). Using this scale of technology, each stage would occupy <~10 square $\mu$m and dissipate <~10 $\mu$W when running at 100 MHz. Since each delay line consumes about 1 mW and occupies only a small area, it is possible to integrate a large number of delay lines to control a number of different timing edges on one CMOS integrated circuit.

For simplicity of disclosing the present invention, it has been tacitly assumed in the disclosure so far that all the inverter stages have a delay of 100 psec. In general, this will not be true. Whatever the nominal value of the delay may be, those of ordinary skill in the art will understand that there will be a variation in the measured delay from lot to lot. In fact, there will be a small variation in the stage delay on the same wafer and even within the same die. Additionally, the stage delay will vary as a function of voltage and temperature. The stage delay will decrease as the voltage supplies to the delay lines increases and will increase as the temperature increases.

The easiest way to handle the manufacturing variation in stage delay is to simply measure and adjust the tap settings accordingly. For example, assume that it is required that the timing accuracy be better than 100 psec and that the nominal resolution is 25 psec after the use of multiple delay lines as discussed with respect to FIG. 2. Further assume that the desired vernier delay is 5.4 nsec (i.e. 5,400 psec). This would require that the 216th tap be used (i.e., 25 psec×216=5.4 nsec). However, if the true stage delay is 21 psec, the 257th tap would be used. According to one aspect of the present invention, the true delays for each delay line are measured and stored in a look up table that selects the correct tap for any desired delay. Those of ordinary skill in the art will appreciate that there are numerous ways to implement such a lookup table. For example, a nonvolatile memory could be associated with each individual integrated delay line circuit and used to store the look-up tables for that delay line. The design and operation of look up tables is well known in the art.

According to the present invention, there are two ways to approach the environmentally induced delay variation. Both require that the dependence of the delays on the significant environmental variable be measured and the results stored in memory. In addition, the circuit must sense the significant variables. Assuming that the significant variables are substrate temperature and delay line supply voltage, there are well known means of measuring these variables.

One approach to adjusting for the variation in environmental parameters according to the present invention is to used the known variation in the delay to select the correct tap for a given delay in the same manner in which the process induced variations are managed according to the disclosure herein. This approach is illustrated in FIG. 4.

Figure 4:
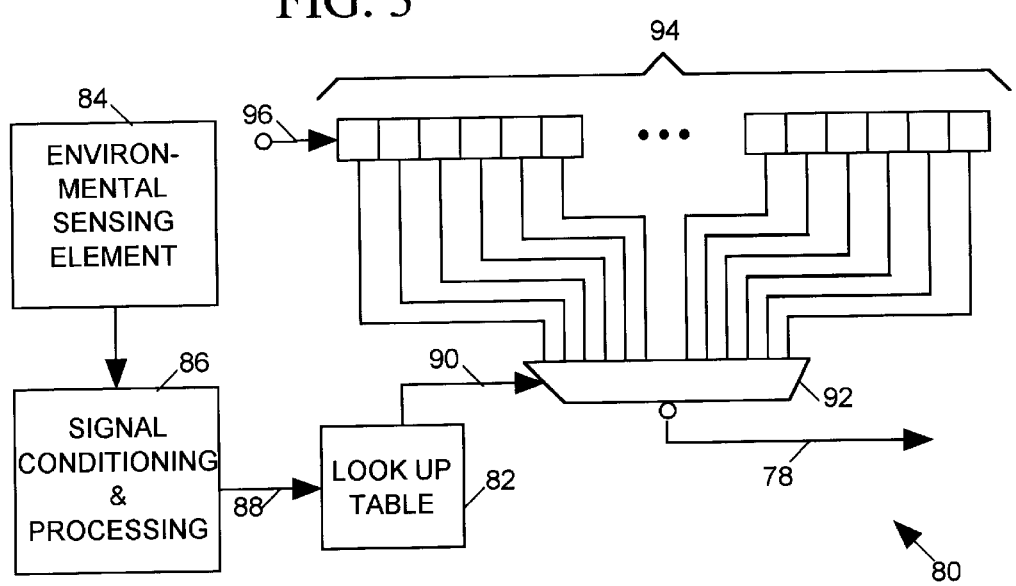
FIG. 4 is a block diagram of a measurement system in accordance with the present invention in which the significant environmental variable is measured and is used to generate a feedback signal that maintains the correct timing by selecting the correct timing tap based on results measured earlier and stored in a look-up table.

In the circuit 80 of FIG. 4, a look up table 82 contains the actual measured delays of the various taps as a function of the environmental variable. The environmental variable is measured by a sensing element 84. The type of sensing element 84 will, of course, depend on the variable being measured. For example, when the variable to be sensed is temperature, one of several well-known temperature sensors can be employed. When the when the variable to be sensed is voltage, equally well-known voltage sensing circuits may be employed.

The output of sensing element 84 is subjected to signal conditioning and processing in block 86 to produce a signal to drive the look up table. The type of signal conditioning and processing necessary to be performed in block 86 to provide input to look up table 82 is well known in the art. The signal driving the look up table is a set of addresses generated by block 86 corresponding to measured values of the environmental variable of interest. The contents of the addresses specified by the signal to look up table 82 map the desired delays to the environmental variable of interest.

The address generated in block 86 appears on bus 88 and is thus is provided to look up table 82. The output of look up table 82 drives the correct control signal onto control bus 90 to the multiplexer 92. The signal to the multiplexer 92 selects the correct output of the delay line 94 to maintain the desired relationship between the input clock at input node 96 and the output clock at the output node 98 connected to the output of multiplexer 92.

A second approach to this problem according to the present invention is to adjust the delay lines to keep the delay constant over the allowed range of environmental variables. This approach is illustrated in the circuit of FIG. 5 to which attention is now drawn.

Figure 5:
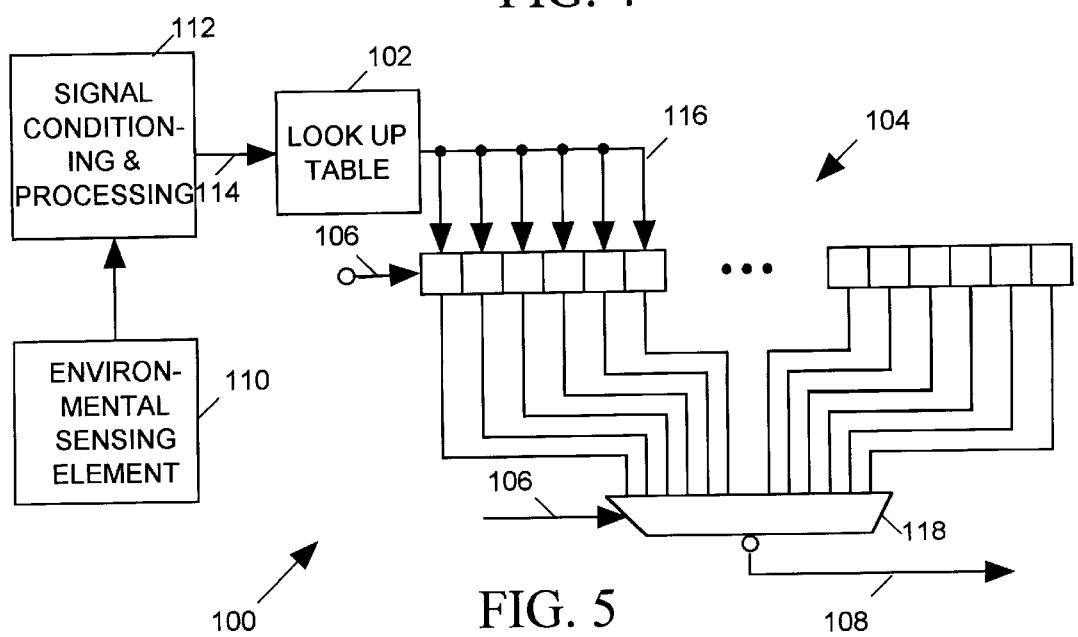
FIG. 5 is a block diagram of a measurement system in accordance with the present invention in which the significant environmental variable is measured and is used to generate a feedback signal that maintains the correct timing by modulating the delay through the timing chain based on results measured earlier and stored in a look-up table.

In the circuit 100 of FIG. 5, look up table 102 contains a mapping of the information that should be applied to the delay line 104 to keep the timing relationship between the input clock signal at input node 106 and the output signal at output node 108 constant as a function of the change in the environmental variable of interest. According to this aspect of the present invention, the output of the environmental sensing element 10 fed to conditioning and processing block 112, is conditioned and processed to generate an address on bus 114 to the look up table 102. The address presented to look up table 102 maps into control signals on bus 116 that adjust the delay line to keep constant the relationship between input clock signal 106 and the signal at output node 108. In this implementation of the present invention, the multiplexer 118 is used to set the correct delay for the nominal set of environmental variables.

For example, the voltage to the delay lines could be adjusted on chip to correct for changes in substrate temperature. A contact temperature sensing probe is placed in contact with the substrate. If a temperature increase is sensed, the delay line supply voltage may be increased enough to compensate by using a programmable power supply as is known in the art. In this case the look up table would contain data used to control the magnitude of the applied power supply voltage to supply for a given substrate temperature.

Another example would to use the control signal from the look up table to switch in or out capacitive loads for inverters of the type shown in FIG. 4 in order to maintain the desired delay through the system 80. This may be accomplished by providing inverters such as the one depicted in FIG. 4 to one or more early stages of the delay line 104 with signals on bus 116 driving the gates of the delay control transistor (reference numeral 70 in FIG. 4). While, for purposes of illustration, five such control signals driving five such adjustable delay inverters are shown, those of ordinary skill in the art will recognize that an arbitrary number of inverters may be provided depending on the total range of adjustment contemplated for any particular design.

While embodiments and applications of this invention have been shown and described, it would be apparent to those skilled in the art that many more adaptions and modifications than mentioned above are possible without departing from the inventive concepts herein. The invention, therefore, is not to be restricted except in the spirit of the appended claims.

What is claimed is:

1. An apparatus for producing an output signal with an adjustable delay following reception of an input signal, the apparatus comprising:
   an output terminal at which said output signal is generated;
   a first tapped delay line for receiving the input signal and for producing a plurality of first tap signals in delayed response to said input signal;
   a second tapped delay line for receiving the input signal and for producing a plurality of second tap signals in delayed response to said input signal, wherein all of said first and second tap signals are of differing phase relative to one another; and
   means for selectively applying any one of said first and second tap signals to said output terminal thereby to produce said output signal.

2. The apparatus in accordance with claim 1
   wherein said first tapped delay line comprises a first plurality of delay stages connected in series, each producing a separate one of said first tap signals as output, and
   wherein said second tapped delay line comprises a second plurality of delay stages connected in series, each producing a separate one of said second tap signals as output.

3. The apparatus in accordance with claim 1 wherein said means for selectively applying any one of said first and second tap signals to said output terminal thereby to produce said output signal comprises:
   selection means for selecting and applying one of said first and second tap signals to said output terminal in accordance with a value of tap signal selection control data supplied as input to said selection means; and
   means for generating and applying said tap selection control data as input to said selection means, said tap selection control data having a value set in response to an environmental variable affecting amounts by which said first and second delay means delay said input signal to produce said first and second tap signals.

4. The apparatus in accordance with claim 1 wherein said first and second tapped delay lines delay said input signal by amounts influenced by delay control data supplied as input to said first and second tapped delay lines to produce said first and second tap signals.

5. The apparatus in accordance with claim 4 further comprising:
   means for generating and applying said delay control data as input to said first and second tapped delay lines, said delay control data having a value set in response to an environmental variable affecting amounts by which said first and second delay means delay said input signal to produce said first and second tap signals.

6. The apparatus in accordance with claim 5 where said environmental variable is a temperature of said first and second tapped delay lines.

7. The apparatus in accordance with claim 5
   wherein said first tapped delay line comprises a first plurality of delay stages connected in series, each producing a separate one of said first tap signals as output, and
   wherein said second tapped delay line comprises a second plurality of delay stages connected in series, each producing a separate one of said second tap signals as output.

8. The apparatus in accordance with claim 7 wherein each delay stage of said first and second plurality of delay stages comprises:
   means having an output node for producing one of said first and second tap signals at said output node, and
   means for controlling a capacitance at said output node in response to said control data.

9. The apparatus in accordance with claim 8 wherein said means for controlling a capacitance at said output node in response to said control data comprises a transistor having one terminal tied to said output node and having a gate terminal controlled by said control data.

10. An apparatus for producing an output signal with an adjustable delay following reception of an input signal, the apparatus comprising:
    an output terminal at which said output signal is generated;
    a tapped delay line for receiving the input signal and for producing a plurality of tap signals in delayed response to said input signal, said tapped delay line comprising a plurality of delay stages connected in series, each delay stage having an output node for producing a separate one of said tap signals, each delay stage including means for controlling a capacitance at said output node in response to control data supplied as input t hereto; and
    means for selectively applying any one of said tap signals to said output terminal thereby to produce said output signal.

11. The apparatus in accordance with claim 10 wherein said means for controlling a capacitance at said output node in response to said control data comprises a transistor having one terminal tied to said output node and having a gate terminal controlled by said control data.

12. The apparatus in accordance with claim 10 further comprising means for generating and applying said delay control data as input to said delay stages, said delay control data having a value set in response to an environmental variable affecting amounts by which said tapped delay line delays said input signal to produce said tap signals.

13. The apparatus in accordance with claim 12 where said environmental variable is a temperature of said tapped delay line.

14. The apparatus in accordance with claim 13 wherein said means for controlling a capacitance at said output node in response to said control data comprises a transistor having one terminal tied to said output node and having a gate terminal controlled by said control data.

15. The apparatus in accordance with claim 10 wherein said means for selectively applying any one of said tap signals to said output terminal thereby to produce said output signal comprises:

selection means for selecting and applying one of said tap signals to said output terminal in accordance with a value of tap signal selection control data supplied as input to said selection means; and means for generating and applying said tap selection control data as input to said selection means, said tap selection control data having a value set in response to an environmental variable affecting amounts by which said delay line delays said input signal to produce said tap signals.

* * * * *